United States Patent [19]
Fujimoto

[11] Patent Number: 5,717,353
[45] Date of Patent: Feb. 10, 1998

[54] CLOCK SIGNAL GENERATING CIRCUIT

[75] Inventor: Yukihiro Fujimoto, Kanagawa-ken, Japan

[73] Assignee: Kabushiki Kaisha Toshiba, Kawasaki, Japan

[21] Appl. No.: 534,388

[22] Filed: Sep. 27, 1995

[30] Foreign Application Priority Data

Sep. 29, 1994 [JP] Japan ................. 6-234881

[51] Int. Cl.$^6$ .................. H03L 7/06; H03K 5/159
[52] U.S. Cl. .......... 327/276; 327/236; 327/155; 327/161
[58] Field of Search .................. 327/147, 149, 327/150, 154, 155, 156, 152, 153, 158, 159, 160, 161, 233, 234, 236, 244, 245, 261, 276, 278, 281, 243, 277; 331/14, 17

[56] References Cited

U.S. PATENT DOCUMENTS

| | | | |
|---|---|---|---|
| 4,495,468 | 1/1985 | Richards et al. | 327/158 |
| 4,603,298 | 7/1986 | Malka et al. | 327/147 |
| 4,922,141 | 5/1990 | Lofgren et al. | 327/276 |
| 5,126,693 | 6/1992 | Gulliver et al. | 331/14 |
| 5,399,995 | 3/1995 | Kardontchik et al. | 331/17 |
| 5,486,783 | 1/1996 | Baumert et al. | 327/147 |

*Primary Examiner*—Timothy P. Callahan
*Assistant Examiner*—Eunja Shin
*Attorney, Agent, or Firm*—Foley & Lardner

[57] ABSTRACT

A phase-synchronizing type clock signal generating circuit including a DLL (delay line loop) circuit, capable of performing a similar operation for a DLL circuit even under the low-speed operation as in the high-speed operation. The clock signal generating circuit includes: a delay circuit for delaying an internal clock signal upon receipt of a reference clock signal externally provided; a selector circuit which selects and outputs either the reference clock signal or an output from the delay circuit, in accordance with a selector signal externally provided; a buffer circuit which delays the internal clock signal for as long as a signal passing delay time duration for the selector circuit; and a delay line loop which delays the reference clock signal upon receipt of an output signal from the selector circuit and that from the buffer circuit.

15 Claims, 6 Drawing Sheets

COMPARATOR 4

FIG.4

LOOP FILTER 5

TEST-ENABLE SIGNAL IS INVALID
(DURING NORMAL OPERATION)

FIG.7

TEST-ENABLE SIGNAL IS VALID
(TESTING PERIOD)

FIG.8

CLOCK SIGNAL GENERATING CIRCUIT

BACKGROUND OF THE INVENTION

1. Technical Field

The present invention relates to DLL (Delay Line Loop) type clock signal generating circuit utilizing a delay line, and it particularly relates to the clock signal generating circuit which is suitable for a semiconductor LSI circuit that operates at high speed under high frequency.

2. Background Art

In a semiconductor device having therein microprocessor and its peripheral circuit and the like, it is required to operate at high frequency. Moreover, since a plurality of chips are used in combination, it is required to operate in synchronism with a system clock of each LSI and externally provided clock.

In such an LSI operating at high speed, internal clock signal of the LSI is controlled by a signal generating circuit which utilizes a phase locked loop (PLL) circuit, in order to suppress the delay of an internal clock of an internal circuit against an input clock signal externally provided and in order to synchronize with clock signals of other LSI's. Moreover, in an oscillator there is employed a delay line loop (DLL) technique whereby a reference clock signal is delayed by a single cycle so as to be synchronized with a rise-up of the next reference signal.

Figure 1:
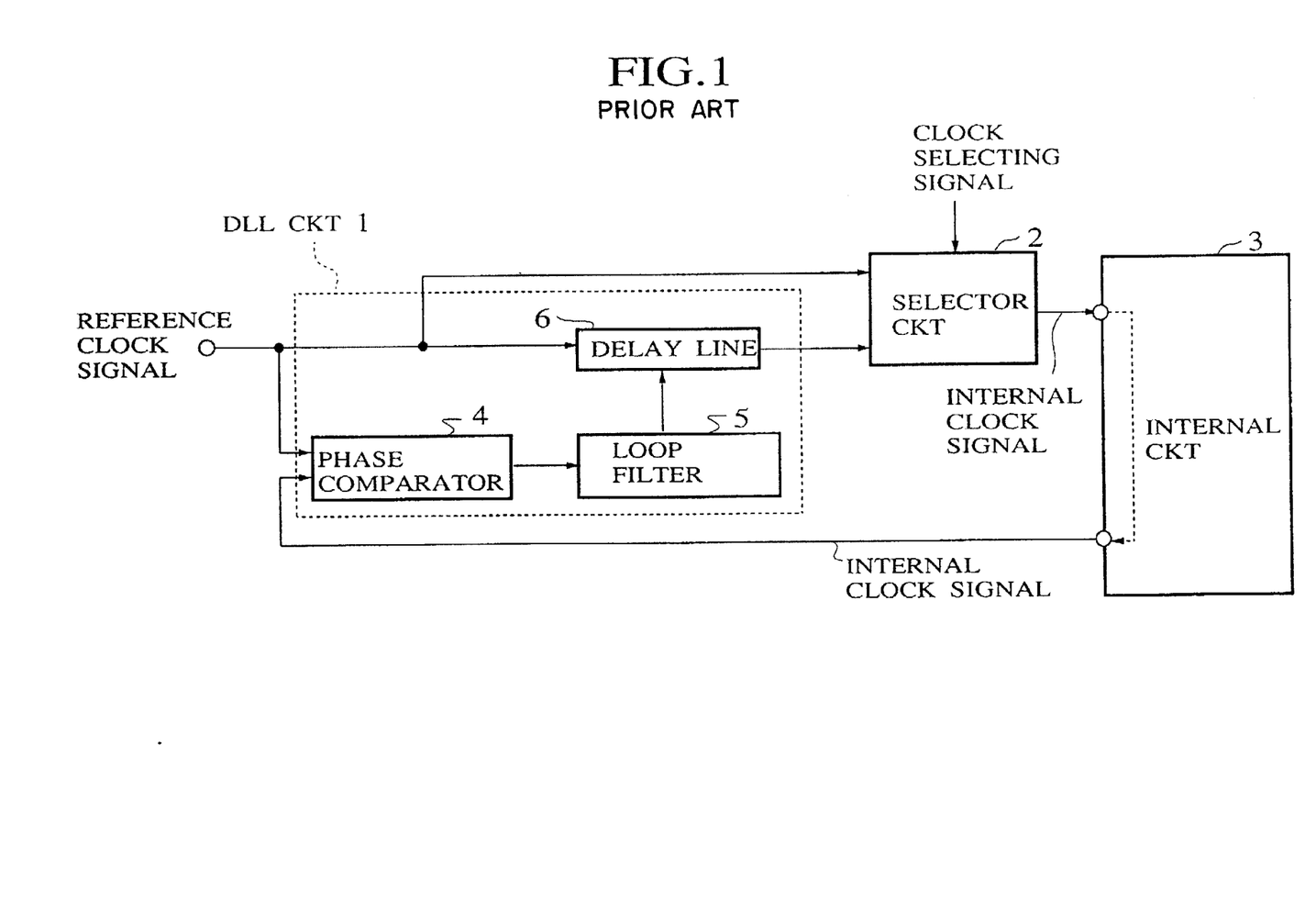
FIG. 1 shows a configuration for the clock signal generating circuit utilizing the conventionally available DLL circuit.

FIG. 1 shows a configuration for the clock signal generating circuit utilizing the conventionally available DLL circuit. In the same figure, the clock signal generating circuit is composed of DLL circuit 1 and selector circuit 2.

With reference to FIG. 1, the DLL circuit 1 is composed of a phase comparator 4 which detects the phase difference between the reference clock signal from an external portion and the internal clock signal used in internal circuit 3; a loop filter 5 which varies the output voltage in accordance with an output of the phase difference detected at the phase comparator 4; and delay line 6 which varies a delayed amount in accordance with the output voltage from the loop filter 5.

While activated, an output signal of the DLL circuit 1 is selected by a selector circuit as an internal clock signal, so as to be supplied to the internal circuit 3. The internal clock signal thus supplied is fed to phase comparator 4 via internal circuit 3, so that phase comparator 4 compares the internal clock signal to the reference clock signal.

In the clock signal generating circuit described above, delayed by delay line 6 is the internal clock signal which is delayed away from the reference signal. In phase comparator 4, a phase difference between the delayed internal clock signal and the rising edge of the next reference clock signal is detected, so that the output potential is either increased or reduced in accordance with the detected phase difference. Delay line 6 changes the delayed time according to the output potential so that the phase difference can be offset.

By repeating the above operation, the internal clock signal is delayed by delay line 8 by exactly one cycle away from the reference clock signal, so that the phase difference between the internal clock signal and the next reference clock signal disappears and can not be detected. When this occurs, loop filter 5 maintains the then output voltage, and DLL circuit 1 continues to generate the internal clock signal whose phase is synchronized with the reference clock signal.

Selector circuit 2, serving as a supply source for the internal clock signal, selects either the output signal of DLL circuit 1 or the reference clock signal in accordance with the clock selecting signal supplied externally. Thereby, the output signal of DLL circuit 1 and the reference clock signal supplied externally are switched so as to be utilized in internal circuit 3.

Accordingly, when the DLL circuit 1 is used, the internal clock signal inside the LSI circuit does not bear phase difference from the reference clock signal supplied externally, but does synchronize with it, there is an advantageous aspect where an LSI delay due to buffering of an internal portion is not caused.

However, in this conventional clock signal generating circuit, there is a limit in the range to be delayed in DLL circuit 1, so that a frequency range which can be locked will also be subjected to the limit. In other words, lock-possible minimum frequency and maximum frequency for DLL circuit 1 are determined by maximum delayed time and minimum delayed time for delay line 8.

Therefore, in a case where an evaluation test such as burn-in test required for evaluating the LSI circuits is performed on the DLL circuit 1 which is optimized at normal-time high speed operation (e.g. 20 MHz–200 MHz), the DLL circuit 1 can not be processed. That is, when an evaluation apparatus which can be operated at a high speed is not available, the test is executed at a low clock frequency such as 1 MHz or below. Here, procedures for the burn-in test are performed in order to help to identify any latent component defects that might cause the circuit to fail in the field.

Thus, at the time of the slow-operation test, the reference clock signal provided externally is selected, as an internal clock signal, by selector circuit 2. In these cases where the circuit operates at the low speed, the delay of the internal clock signal does not affect the operation of LSI circuits, so that it is not necessary to generate the internal clock signal by utilizing DLL circuit 1, thus not causing any problem in the operation of the LSI circuits.

However, in these conventional clock signal generating circuits, the DLL circuit 1 can not be evaluated since the DLL circuit 1 is not operated at the time of test evaluation. Thereby, stress can not be applied to the whole DLL circuit 1 when performing the burn-in test, so that all LSI circuits can not be sufficiently evaluated.

On the other hand, for example, even if the DLL circuit 1 can be optimized which can be locked under low-speed operation, the circuit must be designed considering the low frequency range which is not used under the normal operational mode. This extra designing process results in unnecessary designing labor and unnecessary circuits.

As have been described so far, in the conventional phase-synchronizing type clock signal generating circuits utilizing the DLL circuit, the lock-possible frequency range for the DLL circuit is set along with the high-speed operation of the LSI circuits. Therefore, in the case where the clock signal generating circuit must be operated under the low frequency, for example, when performing the burn-in test, the DLL circuit is not subjected to the normal operational situation where the high frequency signals are locked. Thus, the stress can not be applied to the DLL circuit; consequently, there is caused a disadvantage where a sufficient and reliable test evaluation can not be given.

SUMMARY OF THE INVENTION

In view of the foregoing drawbacks, it is therefore an object of the present invention to provide a phase-synchronizing type clock signal generating circuit including a DLL (delay line loop) circuit, which is capable of performing a similar operation for a DLL circuit even under the low-speed operation same as in the high-speed operation.

To achieve the object, there is provided a clock signal generating circuit including an internal circuit therein, of phase synchronizing delay line loop type, the circuit comprising:

a delay means for delaying an internal clock signal upon receipt of a reference clock signal externally provided;

a selector means which selects and outputs either the reference clock signal or an output from said delay means, in accordance with a selector signal externally provided;

a buffer means which delays the internal clock signal for as long as a signal passing delay time duration for the selector means; and a delay line loop means which delays the reference clock signal upon receipt of an output signal from said selector means and that from said buffer means.

There is also provided a clock signal generating circuit comprising: a first delay means for delaying an internal clock signal upon receipt of a reference clock signal externally provided and a delay setting signal provided externally so that the reference clock signal is delayed arbitrarily within a delay time limit; a selector means which selects and outputs either the reference clock signal or an output from said delay means, in accordance with a selector signal externally provided; a buffer means which delays the internal clock signal for as long as a signal passing delay time duration for the selector means; and a delay line loop means which delays the reference clock signal upon receipt of an output signal from said selector means and that from said buffer means.

One advantage of the present invention lies in that even when a high-speed testing equipment is not available at hand and the LSI's have to be tested under low clock frequency, the DLL circuit can be properly tested and evaluated; especially in the event of performing a burn-in test an appropriate stress can be applied to the DLL circuit, so that the defect-detecting efficiency is significantly improved.

Another advantage of the present invention is that the delay setting signal is provided externally to the first delay line means, so that the reference clock signal can be delayed for arbitrary duration. Thereby, an operational frequency of the DLL circuit at the time of the slow operation of LSI circuits can be arbitrarily set, thus being extremely effective when evaluating the LSI's.

BRIEF DESCRIPTION OF THE DRAWINGS

These and other objects, features and advantages of the present invention will become more apparent from the following description of the preferred embodiment taken in conjunction with the accompanying drawings, in which.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings.

Basic Embodiment

Figure 2:
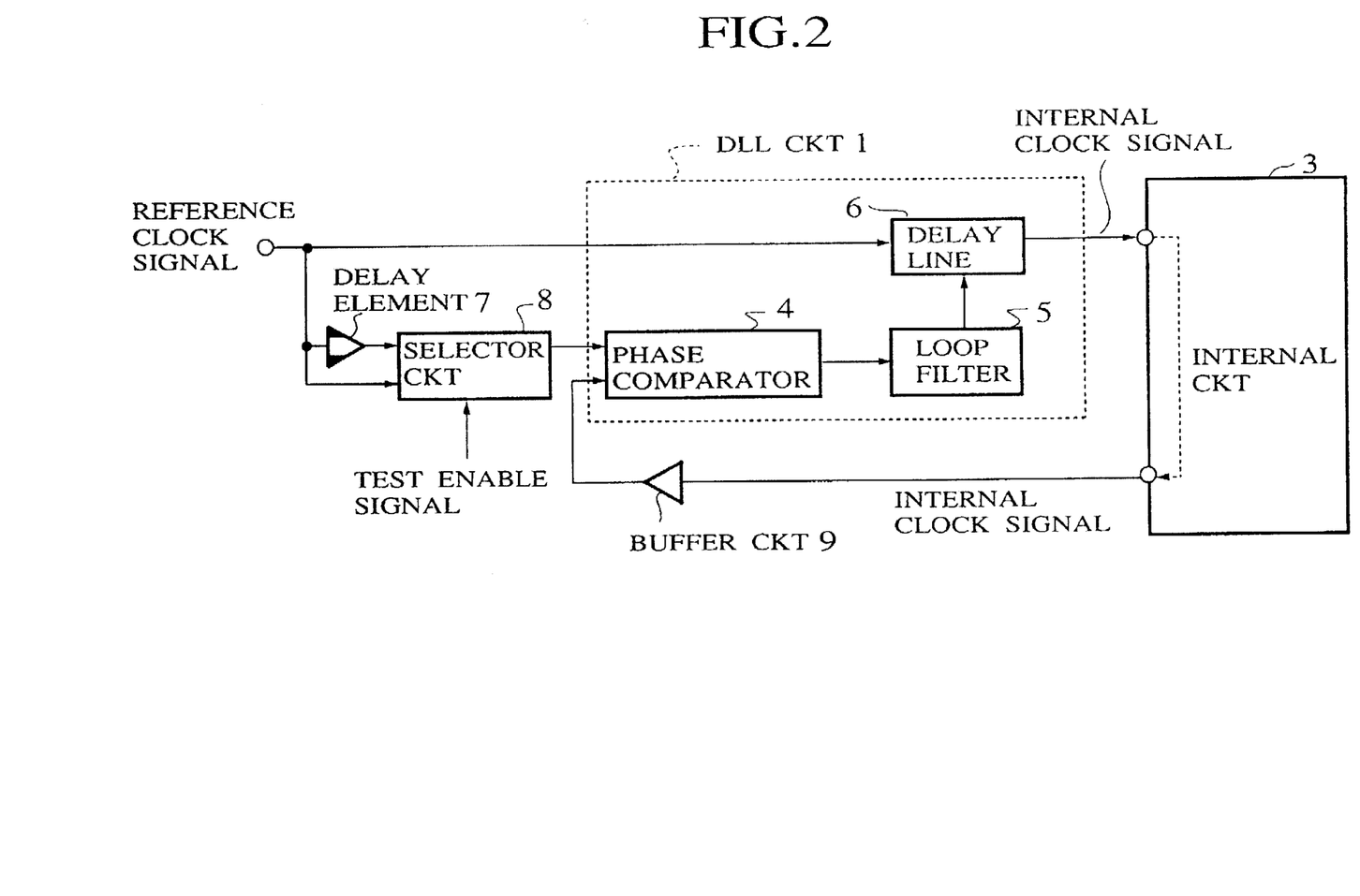
FIG. 2 is a configuration showing a clock signal generating circuit according to the first embodiment of the present invention.

FIG. 2 is a configuration for a clock signal generating circuit according to the first embodiment of the present invention.

With reference to FIG. 2, in addition to a DLL (delay line loop) circuit 1 similarly shown in FIG. 1, the clock signal generating circuit according to the first embodiment comprises: delay element 7 which receives and delays a reference clock signal supplied externally; selector circuit 8 which selects either an output signal of the delay element 7 or the reference clock signal, in accordance with a test-enable signal and buffer circuit 9 which gives an internal clock signal a same degree of signal delay as caused in the event that the signal passes through the selector circuit 8, upon receipt of the internal clock signal which is output via the internal circuit 3 connected to the the DLL circuit 1.

The DLL circuit 1 usually comprises: a phase comparator 4 which outputs a signal in accordance with a phase difference after comparing the phase difference between output signals of the selector circuit 8 and the buffer circuit 9; loop filter 5 which varies an output potential in accordance with the phase difference output from the phase comparator 4; and delay line 6 which delays the reference clock signal based on the output potential of the loop filter 5, whereby the internal clock signal is generated so that there is no phase difference between the output signals between the selector circuit 8 and the buffer circuit 9. It is preferable that in the delay element 7 a delay time duration which is virtually equivalent to that of operational frequency under the normal operation of the internal circuit 3 is set up in advance. For example, the delay time may be approximately 10 ns for LSI whose operational frequency is approximately 100 MHz.

Figure 3:
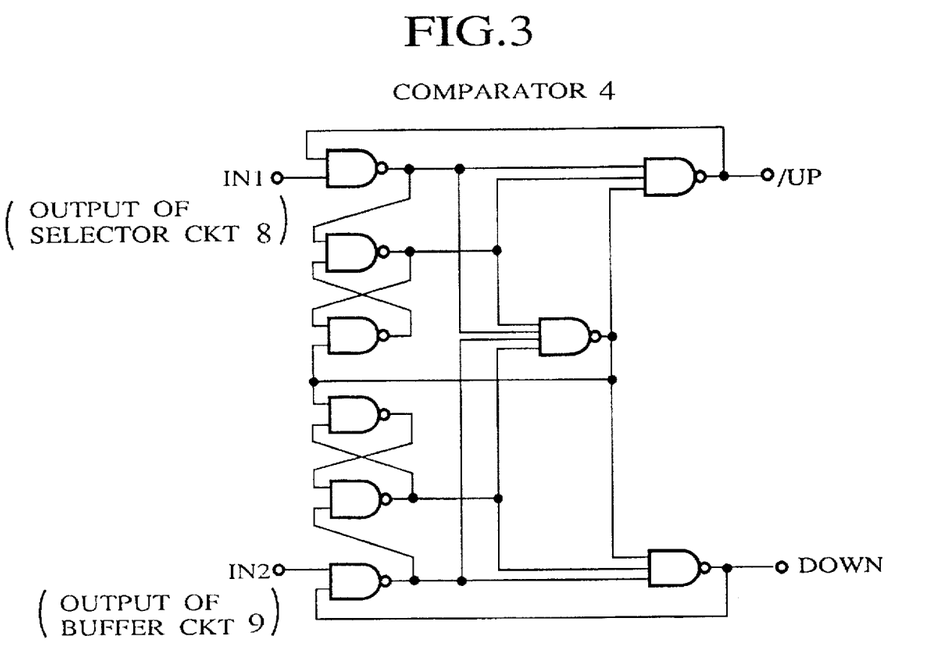
FIG. 3 shows an example of the configuration for the comparator 4 in the clock signal generating circuit shown in FIG. 2.

FIG. 3 shows an example of the configuration for the comparator 4 in the clock signal generating circuit shown in FIG. 2.

Referring to FIG. 3, the phase comparator 4 is comprised of a plurality of logic gates such as NAND gates and has two input terminals (IN1, IN2) and two output terminals (/UP, DOWN). An output signal of the selector circuit 8 is input to the input terminal IN1 of the phase comparator 4, while the output signal of the buffer circuit 9 is input to the input terminal IN2 of the phase comparator 4. Then, when the phase of the output signal for the buffer 9 is forward than that of output signal for the selector circuit 8, that is, when the phase of the internal clock signal is forward than the reference clock signal provided externally, a DOWN signal output from the output terminal DOWN is activated. On the other hand, when the phase of the output signal for the selector circuit 8 is forward than that of output signal for the buffer circuit 9, that is, when the phase of the internal clock signal is delayed to the reference clock signal externally provided, the /UP signal output from the output terminal /UP is activated. These output signals are output for a predetermined time duration corresponding to the respective phase differences.

Figure 4:
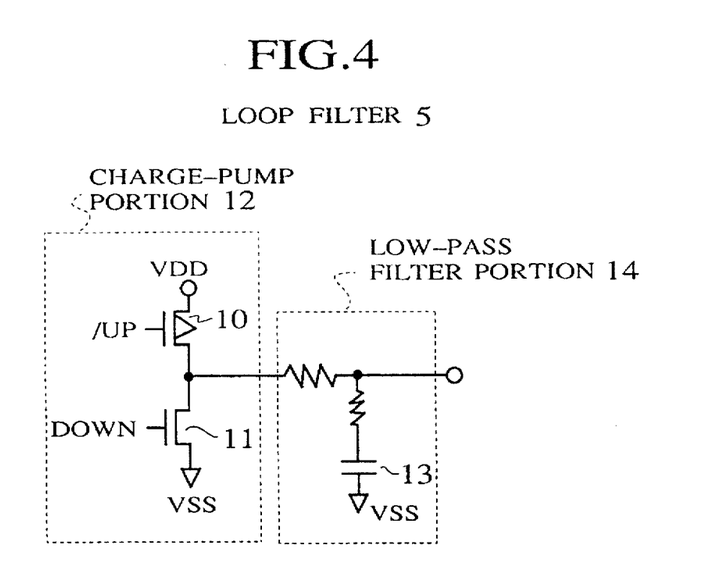
FIG. 4 shows an example of the configuration for the loop filter 5 in the clock signal generating circuit shown in FIG. 2.

FIG. 4 shows an example of the configuration for the loop filter 5 in the clock signal generating circuit shown in FIG. 2.

Referring to FIG. 4, the loop filter 5 comprises: charge-pump portion 12 composed of P-channel MOS (Metal-Oxide Semiconductor) type FET (Field-Effect Transistor) 10 and N-channel MOS type FET 11; and low-pass filter portion 14 composed of a resistor and a capacitor 13.

The loop filter 5 thus configured as above will operate as follows.

When the phase comparator 4 activates the /UP signal which is then fed to the loop filter 5, the PMOSFET 10 of the charge-pump portion 12 becomes ON. Then, the capacitor 13 of the low-pass filter portion 14 is charged up, and an output potential of the loop filter 5 increases.

On the other hand, when the phase comparator 4 activates the DOWN signal which is then fed to the loop filter 5, the NMOSFET 11 of the charge-pump portion 12 becomes ON. Then, the capacity of capacitor 13 is discharged, and the output .potential is decreased. Accordingly, the charge-pump portion 12 converts digital signals (/UP signal, DOWN signal) supplied from the phase comparator 4, into analog values, and the charge-pump portion 12 also operates to maintain the output potential, whereby a high-frequency component such as noise is removed by the low-pass filter portion 14.

Figure 5:
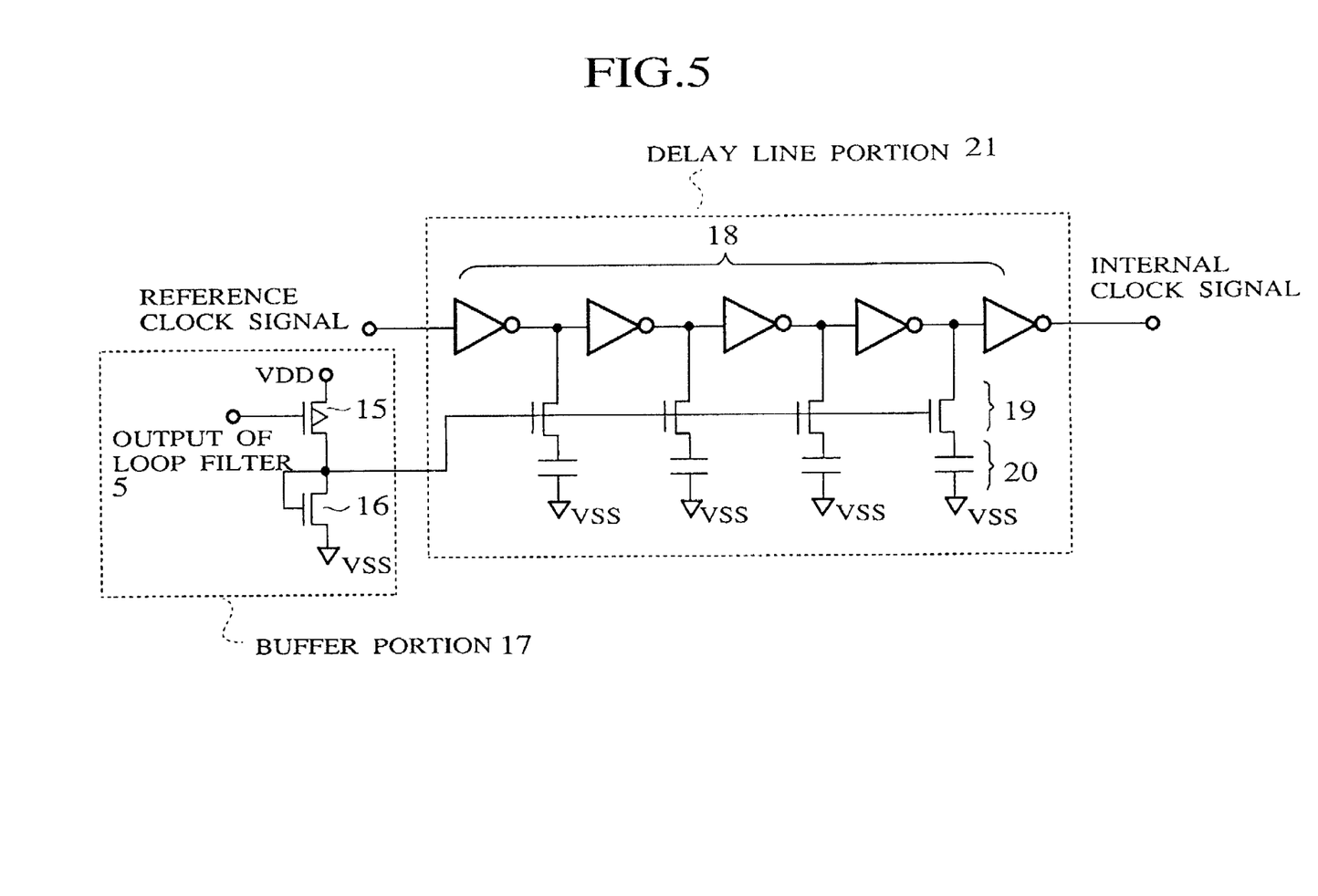
FIG. 5 shows an example of the configuration for the delay line 6 in the clock signal generating circuit shown in FIG. 2.

FIG. 5 shows an example of the configuration for the delay line 6 in the clock signal generating circuit shown in FIG. 2.

Referring to FIG. 5, the delay line comprises: buffer portion 17 composed of PMOSFET 15 and NMOSFET 16 which convert an output of the loop filter S to an opposite phase; and delay line portion 21 composed of a plurality of inverter circuits 18, and NMOSFET's and capacitors 20 which are connected to the respective inverter circuits.

The delay line 6 thus configured as above will operate as follows.

When the output potential of the loop filter 5 is high, a gate potential of NMOSFET 19 in the delay line portion 21 is low, so that amount of current flowing between a source and drain of the FET 19 is small. Therefore, the value of the capacitor 20 is apparently diminished against the inverter circuit 18 of the delay line portion 21, so that a gate delay for the inverter 18 is minimized. Thereby, a signal delay time of the delay line 6 also becomes small.

On the other hand, when the output potential of the loop filter 5 is low, the gate potential of NMOSFET 16 in the buffer portion 17 becomes high, so that amount of the current flowing between the source and drain of FET 16 is increased. Therefore, the value of the capacitor 20 is apparently increased against the inverter circuits 18 of the delay line portion 21. Thereby, the signal delay time of the delay line 6 becomes increased. As described above, the delay time of the delay line 6 can be varied by the output potential of the loop filter 5.

Operations

Figure 6:
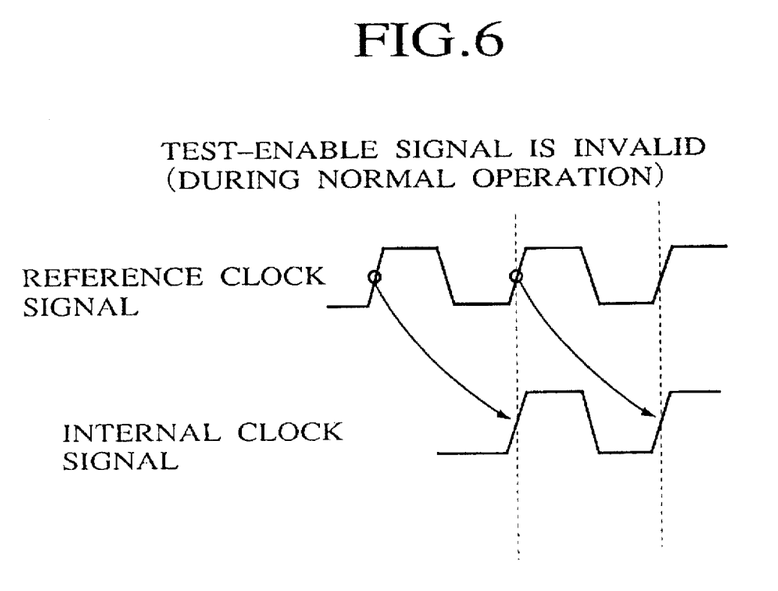
FIG. 6 is a timing chart for the circuit shown in FIG. 2, during a normal operation period.
Figure 7:
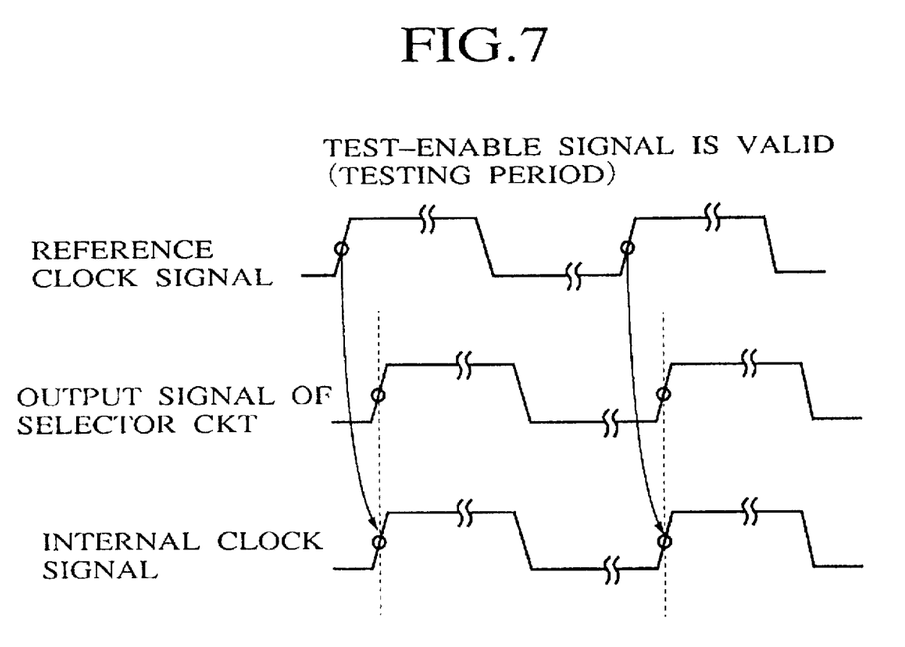
FIG. 7 is a timing chart for the circuit shown in FIG. 2, during a slow operational period (testing period).

Next, the operations for the above-described embodiment will be described with reference to FIG. 6 and FIG. 7, where FIG. 6 is a timing chart illustrating the high-speed or normal operation and FIG. 7 is another timing chart illustrating the slow or testing operation.

First, at the time of the normal operation, that is, at the time of high-speed operation of LSI circuits, a test-enable signal is activated and then the reference clock signal is selected by the selector circuit 8. In this instance, referring to FIG. 6, the delay line 6 in the DLL circuit 1 delays the reference clock signal by exactly one cycle behind the reference clock to produce the internal clock signal so that there is no phase difference in between the reference clock and the internal clock.

The reference clock signal and the internal clock signal are both given the same degree of delay by the selector circuit 8 and the buffer circuit 9, respectively, and are input accordingly to the phase comparator 4. Then, the phase comparator 4 detects the phase difference between the reference clock signal and the internal clock signal. Thus, the phase difference therebetween becomes nil by the fact that the DLL circuit 2 becomes locked. At this time, the DLL circuit 1 operates to delay the reference clock signal by the time duration equivalent to the operation-cycle time (for example, by 10 ns in a case of 100 MHz).

Next, at the time of the testing operation, that is, at the time of slow operation of LSI circuits, a test-enable signal is activated and then the output signal of the delay element 7 is selected by the selector circuit 8. In this instance, referring to FIG. 7, the internal clock signal is adjusted to coincide with the output signal of the selector circuit 8, while the DLL circuit 1 operates in a manner that the reference clock signal is delayed by as much as the delayed time duration of the delay element 7. Since the delay element 7 presents the same delay time with the operation-cycle time under the normal operation (for example, 10 ns in the previous example), the DLL circuit 1 delays the reference clock only by the operation-cycle time under the normal operation. In other words, even though the reference clock signal is of low speed, the DLL circuit 1 can operate in the same manner as in the high-speed operation.

Therefore, even at the time of performing the LSI test at slow operation, the DLL circuit 1 can be tested and evaluated under the same condition as in the normal operation. Thus, in the burn-in test for LSI's, the DLL circuit 1 performs the same operation as under the normal operational condition, so that an appropriate stress can be applied to the DLL circuit 1. Moreover, LSI products are inspected and evaluated thoroughly and defects thereof can be more easily and reliably found, if any. In other words, a defect-detecting efficiency is significantly improved by employing the clock signal generating circuit according to the embodiment of the present invention.

Another Embodiment

Figure 8:
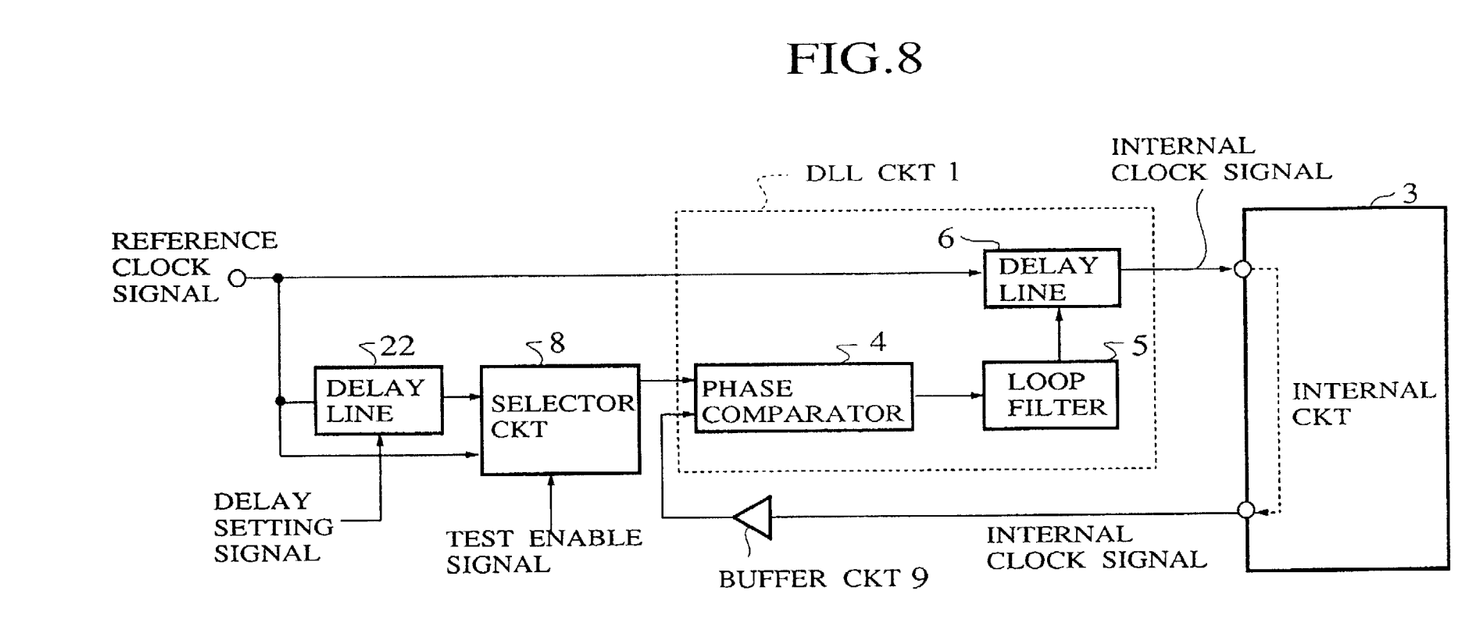
FIG. 8 is a configuration showing a clock signal generating circuit according to the second embodiment of the present invention.

FIG. 8 is a schematic diagram showing a configuration for the clock signal generating circuit according to the another embodiment of the present invention.

This second embodiment features in that there is employed another delay line 22 (FIG. 8) in place of and also as the delay element 7 shown in FIG. 2 of the basic embodiment, while other circuit components are basically identical to those of the first embodiment scheme.

In this second embodiment, a delay setting signal which sets up a delay time for the delay line 22 is provided externally, so that the reference clock signal can be delayed for arbitrary duration within a range that the delay line 22 can delay. Therefore, an operational frequency of the DLL circuit 1 at the time of the slow operation of LSI circuits can be arbitrarily set, thus being extremely effective when evaluating the LSI's.

In summary, by employing the novel phase-synchronizing type clock signal generating circuit according to the present invention, mere addition of a simple circuit to the conventional circuit makes possible that the DLL circuit is operated in the same condition of the usual high-speed operation even in the event of the slow operational mode of LSI, without altering or modifying the DLL circuit.

Thereby, even when a high-speed testing equipment is not available at hand and the LSI's have to be tested under low clock frequency, the DLL circuit can be properly tested and evaluated. In particular, in the event of performing the burn-in test an appropriate stress can be applied to the DLL circuit, so that the defect-detecting efficiency is significantly improved.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. A clock signal generating circuit comprising:

a delay element for receiving a reference clock signal and outputting a first delayed clock signal with a first delay time from said reference clock signal, said first delay time being predetermined in the order of one cycle of said reference clock signal given during the normal operation;

a selector circuit for receiving said reference clock signal, said first delayed clock signal and a test enable signal, outputting said reference clock signal when said test enable signal is not active indicating a normal operation, and outputting said first delayed clock signal when said test enable signal is active indicating a test operation conducted at a frequency which is substantially lower than that of the normal operation;

a delay line loop circuit for receiving said reference clock signal, outputting a second delayed clock signal to an internal circuit with a second delay time from said reference clock signal, and receiving a third delayed clock signal with a third delay time from said internal circuit operating with said second delayed clock signal, said delay line loop circuit also receiving the output of said selector circuit and adjusting said second delay time in order that said third delayed clock signal is in phase with the output of said selector circuit.

2. The clock signal generating circuit as claimed in claim 1 wherein said delay line loop circuit comprises a phase comparator for receiving the output of said selector circuit and said third delayed clock signal in order to output a signal indicative of a differential phase therebetween, a loop filter for receiving the output of said phase comparator and outputting a control voltage proportional to the differential phase, and a delay line for receiving the control voltage from said loop filter in order to give said reference clock signal a delay time corresponding to the differential phase.

3. A clock signal generating circuit including an internal circuit therein, of phase synchronizing delay line loop type, the circuit comprising:

a first delay element for delaying a reference clock signal externally provided and a delay setting signal provided externally so that the reference clock signal is delayed arbitrarily within a delay time limit;

a selector circuit, connected to said first delay element, which selects and outputs either the reference clock signal or an output from said first delay element, in accordance with a selector signal externally provided;

a buffer circuit, connected to the internal circuit, which delays an internal clock signal for as long as a signal passing delay time duration for the selector circuit; and a delay line loop circuit, connected to said selector circuit, said buffer circuit and the internal circuit, which delays the reference clock signal upon receipt of an output signal from said selector circuit and that from said buffer circuit, so that the phase difference between both signals becomes zero.

4. The circuit of claim 1, wherein the delay line loop circuit includes:

a comparator means for detecting a phase difference between the output signal from said selector circuit and said third delayed clock signal upon receipt of both signals;

a loop filter means for outputting a signal to set a delay amount, upon receipt of the phase difference detected by the comparator means; and a delay line means for delaying the reference clock signal in accordance with an output signal from the loop filter means.

5. The circuit of claim 4, wherein the comparator means includes a plurality of logic gates.

6. The circuit of claim 5, the logic gates include NAND gates.

7. The circuit of claim 4, wherein the loop filter means includes a charge-pumping portion and a low-pass filtering portion.

8. The circuit of claim 7, wherein the charge pumping portion in the loop filter means includes a P-channel MOSFET and an N-channel MOSFET.

9. The circuit of claim 4, wherein the delay line means includes:

a buffer portion composed of a PMOSFET and an NMOSFET, which converts an output of the loop filter means to an opposite phase, thereof; and delay line portion composed of a plurality of inverter circuits each of which is connected to NMOSFET and capacitor.

10. The circuit of claim 3, wherein the delay line loop circuit includes:

a comparator circuit for detecting a phase difference between the output signal from said selector circuit and that from said buffer circuit upon receipt of both signals;

a loop filter means for outputting a signal to set a delay amount, upon receipt of the phase difference detected by the comparator means; and a second delay line element for delaying the reference clock signal in accordance with an output signal from the loop filter means.

11. The circuit of claim 10, wherein the comparator means includes a plurality of logic gates.

12. The circuit of claim 11, the logic gates include NAND gates.

13. The circuit of claim 10, wherein the loop filter means includes a charge-pumping-portion and a low-pass filtering portion.

14. The circuit of claim 13, wherein the charge pumping portion in the loop filter means includes a P-channel MOSFET and an N-channel MOSFET.

15. The circuit of claim 10, wherein the second delay line element includes:

a buffer portion composed Of a PMOSFET and an NMOSFET, which converts an output of the loop filter means to an opposite phase thereof; and     delay line portion composed of a plurality of inverter circuits each of which is connected to NMOSFET and capacitor.

* * * * *